United States Patent
Duale

(10) Patent No.: US 7,774,668 B2
(45) Date of Patent: Aug. 10, 2010

(54) SYSTEM AND METHOD FOR DETECTING NON-REPRODUCIBLE PSEUDO-RANDOM TEST CASES

(75) Inventor: Ali Y. Duale, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 219 days.

(21) Appl. No.: 12/039,122

(22) Filed: Feb. 28, 2008

(65) Prior Publication Data
US 2009/0222696 A1  Sep. 3, 2009

(51) Int. Cl.
*G01R 31/28* (2006.01)
(52) U.S. Cl. ..................................... 714/738
(58) Field of Classification Search ............. 714/738, 714/741
See application file for complete search history.

(56) References Cited

U.S. PATENT DOCUMENTS

| | | | |
|---|---|---|---|
| 5,228,042 A | 7/1993 | Gauthier et al. | |
| 5,729,554 A * | 3/1998 | Weir et al. | 714/739 |
| 6,327,686 B1 * | 12/2001 | Grundmann et al. | 714/738 |
| 6,539,503 B1 * | 3/2003 | Walker | 714/703 |
| 6,836,867 B2 * | 12/2004 | Yonetoku | 714/738 |
| 6,978,401 B2 * | 12/2005 | Avvari et al. | 714/38 |
| 7,076,713 B1 * | 7/2006 | Hess | 714/741 |
| 7,246,291 B2 * | 7/2007 | Hong | 714/738 |
| 7,516,376 B2 * | 4/2009 | Okano et al. | 714/726 |
| 2001/0027539 A1 * | 10/2001 | Nozuyama | 714/33 |
| 2005/0149805 A1 * | 7/2005 | Syed et al. | 714/741 |

* cited by examiner

*Primary Examiner*—James C Kerveros
(74) *Attorney, Agent, or Firm*—Cantor Colburn LLP; Steven Chiu

(57) ABSTRACT

A method for monitoring a test case generator system by detecting non-reproducible pseudo-random test cases, comprising: building a first pseudo-random test case having a first sequence of seeds comprising a first starting seed and a first ending seed through the test case generator system; reproducing the first sequence of seeds of the first pseudo-random test case by building a second pseudo-random test case having a second sequence of seeds comprising a second starting seed and a second ending seed through the test case generator system when the test case generator system is operating in a reproduction mode, the first starting seed being used as the second starting seed of the second sequence of seeds; and comparing the first ending seed in the first sequence of seeds to the second ending seed in the second sequence of seeds.

25 Claims, 4 Drawing Sheets

SYSTEM AND METHOD FOR DETECTING NON-REPRODUCIBLE PSEUDO-RANDOM TEST CASES

BACKGROUND OF THE INVENTION

1. Field of the Invention

This invention relates to a test case generator system and a method for monitoring the test case generator system by detecting non-reproducible pseudo-random test cases.

2. Description of Background

Pseudo-random testing is suitable for both unit and system level testing. Such testing enables the generation of input scenarios that a human tester may not come up during testing period of the system. As a result, a well-developed system level pseudo-random test case generator can expose many system errors. Typically, most of these errors are not trivial and need to be well understood before they are fixed.

Without the capability of test case reproduction, a good number of complex errors may not be understood and, hence, cannot be fixed properly. This will affect both the quality of the system under test and the time to market the product since test effectiveness is reduced while both test and development times becomes longer.

SUMMARY OF THE INVENTION

The shortcomings of the prior art are overcome and additional advantages are provided through the provision of a method for monitoring a test case generator system by detecting non-reproducible pseudo-random test cases, comprising: building a first pseudo-random test case having a first sequence of seeds comprising a first starting seed and a first ending seed through the test case generator system; reproducing the first sequence of seeds of the first pseudo-random test case by building a second pseudo-random test case having a second sequence of seeds comprising a second starting seed and a second ending seed through the test case generator system when the test case generator system is operating in a reproduction mode, the first starting seed being used as the second starting seed of the second sequence of seeds; and comparing the first ending seed in the first sequence of seeds to the second ending seed in the second sequence of seeds.

The shortcomings of the prior art are overcome and additional advantages are further provided through the provision of a method for monitoring a test case generator system by detecting non-reproducible pseudo-random test cases, comprising: building a first pseudo-random test case having a first sequence of seeds comprising a first starting seed and a first ending seed through the test case generator system; storing the first starting seed and the second ending seed of the first pseudo-random test case in a storage mechanism; reproducing the first sequence of seeds of the first pseudo-random test case by building a second pseudo-random test case having a second sequence of seeds comprising a second starting seed and a second ending seed through the test case generator system when the test case generator system is operating in a reproduction mode, the first starting seed stored in the storage mechanism being used as the second starting seed of the second sequence of seeds; and comparing the first ending seed in the first sequence of seeds to the second ending seed in the second sequence of seeds.

The shortcomings of the prior art are overcome and additional advantages are further provided through the provision of a test case generator, comprising: a test case building device configured to build a first pseudo-random test case having a first sequence of seeds comprising a first starting seed and a first ending seed, the test case building device further configured to reproduce the first sequence of seeds by building a second pseudo-random test case having a second sequence of seeds comprising a second starting seed and second ending seed when the test case building device is operating in a reproduction mode; a storage device configured to store the first starting seed and the second ending seed of the first sequence of seeds, the test case building device reproduces the first sequence of seeds by using the first starting seed stored in the storage mechanism as the second starting seed of the second sequence of seeds; and a monitoring device configured to compare the first ending seed in the first sequence of seeds to the second ending seed in the second sequence of seeds.

The shortcomings of the prior art are overcome and additional advantages are further provided through the provision of a test case generator, comprising: a test case building device configured to build a first pseudo-random test case having a first sequence of seeds comprising a first starting seed and a first ending seed, the test case building device further configured to reproduce the first sequence of seeds by building a second pseudo-random test case having a second sequence of seeds comprising a second starting seed and second ending seed when the test case building device is operating in a reproduction mode; a storage device configured to store the first starting seed and the second ending seed of the first sequence of seeds, the test case building device reproduces the first sequence of seeds by using the first starting seed stored in the storage mechanism as the second starting seed of the second sequence of seeds; a monitoring device configured to compare the first ending seed in the first sequence of seeds to the second ending seed in the second sequence of seeds; and an indicator device configured to alert an operator when the first ending seed in the first sequence of seeds is different from the second ending seed in the second sequence of seeds.

Additional features and advantages are realized through the techniques of the present invention. Other embodiments and aspects of the invention are described in detail herein and are considered a part of the claimed invention. For a better understanding of the invention with advantages and features, refer to the description and to the drawings.

Technical Effects

As a result of the summarized invention, technically we have achieved a solution for monitoring a test case generator device by detecting non-reproducible pseudo-random test cases.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
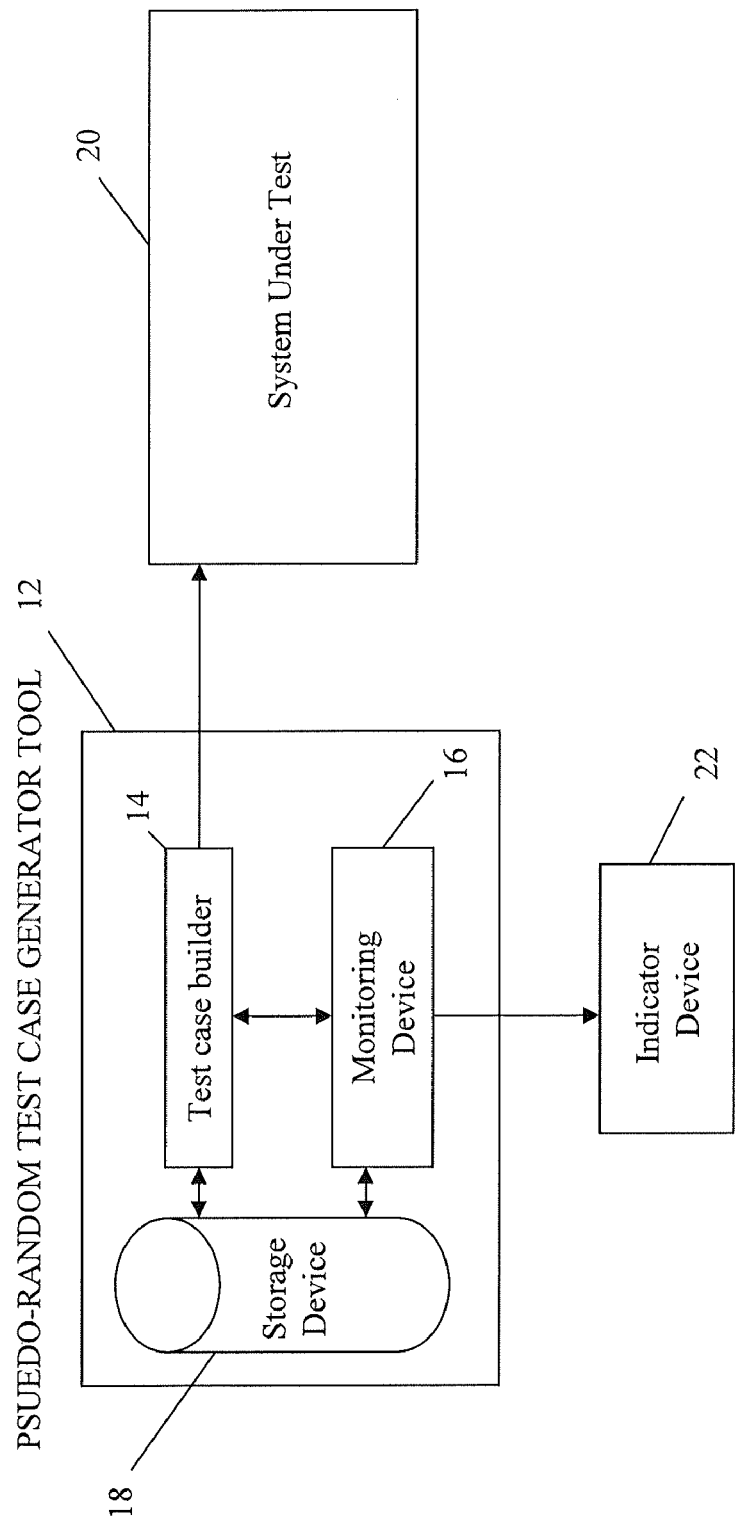
FIG. 1 is a schematic block diagram illustrating a pseudo-random test case generator system in accordance with one exemplary embodiment of the present invention.

The detailed description explains the preferred embodiments of the invention, together with advantages and features, by way of example with reference to the drawings.

DETAILED DESCRIPTION OF THE INVENTION

The present invention and the various features and advantageous details thereof are explained more fully with reference to the non-limiting embodiments that are illustrated in the accompany drawings and detailed in the following description. It should be noted that the features illustrated in the drawings are not necessarily drawn to scale.

Descriptions of well-known or conventional components and processing techniques are omitted so as to not necessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

Exemplary embodiments of the present invention propose a system and method for preserving a sequence of seeds of a test case. Exemplary embodiments of the present invention further propose a system and method for monitoring a pseudo-random test case generation tool to check whether test cases (consisting a large number of machine instructions) built therewith are reproducible by the same. Exemplary embodiments of the present invention further propose a system and method for monitoring for non-reproducible test cases and reporting the same.

The inventor herein has recognized that test case reproduction permits a good number of complex errors within a system under test to be understood and fixed properly, thus enhancing the quality of the system under test and reducing the time to market the system. The inventor herein has further recognized that having a test case generator tool capable of reproducing test cases quickly when needed is desirable so that extra debug information, such as hardware traces, can be collected. Moreover, fixes for detected bugs can be verified. Furthermore, the consistency of a system under test (e.g., server) can be verified. In other words, it is desirable that the system under test responds in the same way to repeated test stimulus (test cases) even when results are not correct. For example, when a test case is executed through a system and the system responds with an error, it is helpful to regenerate that same test case and execute the regenerated test case through the system after the system has been debugged to see if the error remains in the system. The inventor herein has further recognized that having a method for monitoring the test case reproducibility of a test case generator tool by only using seeds (e.g., ending seeds) as the only variable to determine test case reproducibility reduces the time for detecting issues in test case reproducibility.

For a better understanding of the invention and its operation, turning now to the drawings, FIG. 1 is a schematic block diagram illustrating the basic elements of one exemplary embodiment of the present invention. More specifically, FIG. 1 illustrates a test case generator system 10 comprising a pseudo-random test case generator device or tool 12 having a test case builder or test case building device 14, a monitoring device 16, and a storage mechanism 18. In accordance with one exemplary embodiment, the monitoring device 16 and/or the storage mechanism 18 are separate from the test case generator device 12 and in signal communication with the same. In an alternative exemplary embodiment, the monitoring device 16 and/or the storage mechanism 18 are an integral part of the test case generator device 12. The system 10 further includes a system under test 20 in signal communication with the test case builder 14, which can be any conventional system or device (e.g., server). Of course, the system under test 20 can be more than one system or device interconnected together in accordance with exemplary embodiments of the present invention. In accordance with one exemplary embodiment, the system 10 further includes an indicator device 22 configured for reporting or signaling a non-reproducible test case built by the test case builder 14.

In accordance with one exemplary embodiment, the test case builder 14 operably communicates with the monitoring device 16, the storage device 18, and the system under test 20 as shown in FIG. 1. The test case builder 14 is configured for building or generating one or more pseudo-random test cases or test instruction streams for the system under test 20. These pseudo-random test cases are built and executed through the system under test 20 to effectively test the operations/components of the system under test 20 in a system level or otherwise. The pseudo-random test cases each comprises of a test sequence of test seeds or pseudo-random seeds. Each test sequence built by the test case builder 14 includes a starting send and an ending seed. One or more seeds are formed between the starting seed and the ending seed in accordance with one exemplary embodiment.

In accordance with one exemplary embodiment, the test case builder 14 comprises a central processing unit (CPU), which may be any conventional processor configured for carrying out the methods and/or functions described herein. In one exemplary embodiment, the CPU comprises a combination of hardware and/or software/firmware with a computer program that, when loaded and executed, permits the test case builder to operate such that it carries out the methods described herein.

In accordance with one exemplary embodiment, the test case builder 14 selectively operates in a reproduction mode and a non-reproduction mode. During the reproduction mode, a test case (original test case) is reproduced as another test case (reproduced test case) having the same sequence of seeds as the original test case. In contrast, during the non-reproduction mode, a test case is not reproduced; rather, another test case having a different sequence of seeds from the original test case is built. In accordance with one exemplary embodiment, the test case builder 14 selectively operates in alternating fashion between the reproduction mode and the non-reproduction mode. In accordance with one exemplary embodiment, the test case builder 14 selectively operates in a staggered alternating fashion between the reproduction mode and the non-reproduction mode.

In accordance with one exemplary embodiment, an instructional flag is set in the test case builder 14 that controls whether to regenerate a specific test case of the many test cases that can be generated by the test case builder 14. The flag can be set randomly or with a certain frequency (such as every other or every fifth test case). When a test case is being regenerated, the flag is turned off to prevent reproducing a given test case more than once. In accordance with one exemplary embodiment, a reproduced or regenerated test case (re-generation of the original test case) is not executed through the system under test 20 since the reproduced test case is generated only to check for the efficiency of the test case generator tool 12.

In accordance with one exemplary embodiment, the test case builder 14 is configured to simulate a stream of applications (e.g., instructions, commands or otherwise) for building each pseudo-random test case. More specifically, each test sequence of seeds of each pseudo-random test case is built by simulating a stream of applications such that a stream of applications is simulated between each seed including at the initialization of the test case builder 14, which generates the starting seed of each pseudo-random test case. For example, when the test case builder 14 is initialized or operated, a starting seed is generated followed by a stream of applications, which then generates a second seed and that second seed is followed by another stream of applications, which generates a third seed and so forth until an ending seed is generated. The ending seed indicates the end of the random decisions of the pseudo-random test case or the instruction stream.

Each stream of applications is a set of random decisions for producing a new seed to be used for the next random decision or next stream of applications. This creates the sequence of seeds during the generation of each test case or test instruction stream.

In accordance with one exemplary embodiment, test case reproduction depends mainly on configuration, seed preservation, and/or workload (stress on the machine). In other words, for a pseudo-random test case to be reproducible the test case generator device 12 must run on the same machine configuration and possibly the same workload as that of the original environment where the original test case was generated in accordance with one exemplary embodiment.

With respect to the machine configuration, a pseudo-random test case is reproducible by running the pseudo-random test case generator device on the same machine configuration, such as the number of computer processing units (CPUs), storage size of the storage device, etc. In other words, the configuration of the pseudo-random test case generator device 12 must remain the same when the test case builder 14 is operating during the test case reproduction mode. As for the workload, in many cases, the stress present on the pseudo-random test case generator device 12 must be kept the same when the test case builder 14 is operating during the test case reproduction mode in order for the test case to be reproducible.

In accordance with one exemplary embodiment, preserving the consistency of the seed sequences is desirable for a test case to be reproducible. More specifically, it is a necessary condition that the sequence of pseudo-random seeds present in any given test case is repeatable for the test case to be reproducible. In other words, the test case generation device 12 must be capable of regenerating such sequence as long as both the configuration and the workload are kept the same.

In accordance with one exemplary embodiment, a sequence of seeds may not be repeated during the reproduction mode because all or part of the original sequence of pseudo-random seeds may not be generated based on conditions that existed during the original instruction stream generation may not be present when the test case is being reproduced. For example, one or more variables are not initialized during the reproduction mode, which were initialized for the original test case that is being reproduced. As for another example, a test case that is being regenerated may be ended prematurely or extended beyond the ending of the original test case that is being reproduced. As for yet another example, changes in the machine configuration, such as the buffer allocations of the storage device, may exist. Other conditions and scenarios may exist that may prevent a test case from being reproduced or regenerated and should not be limited to the conditions and examples set forth above.

In accordance with one exemplary embodiment, the test case builder 14 builds pseudo-random test cases where one or more is reproduced once or more than once depending on the application. In accordance with one exemplary embodiment, the test case builder 14 stores the initial or starting seed and the ending seed of each sequence of each new pseudo-random test case in the storage device 18, which can be any conventional storage device (e.g., Random Access Memory) in accordance with one exemplary embodiment. When a test case is being rebuilt (i.e., reproduced), the test case builder 14 enables the reproduction mode and the initial seed of the original test case is used to reproduce the original test case. In other words, the starting seed of the original test case is also the starting seed of reproduced test case. As such, the starting seed in the original test case is identical to the starting seed in the subsequent test case, which is a regeneration of the original test case. In doing so, if the configuration and the workload present in the system remains the same, the sequence of seed in the original test case should be identical to the sequence of seeds in the regenerated test case.

When the reproduction mode is enabled in the test case builder 14, the monitoring device 16 is also enabled. The monitoring device 16 is operably in signal communication with the storage device 18 and the test case builder 14 in accordance with one exemplary embodiment. The monitoring device 16 is configured to monitor whether the sequence of seeds for the original test case is repeatable.

In accordance with one exemplary embodiment, the monitoring device 16 compares the ending seed of the original test case to the ending seed of the reproduced test case and determines whether the ending seeds of each are identical. If so, the test case is deemed reproducible and the test case builder 14 continues to either build a new test or apply the regenerated test case on the system. As such, it is assured that the original test case executed by the system under test 20 can be reproducible for the future. In other words, if an error is found in the system under test 20 after the same executes the original test case and that original test case was deemed reproducible; a developer can reproduce the original test case at a later time as long as the configuration and workload remain the same as discussed above. In doing so, the system under test 20 can be verified after it is debugged. In accordance with one non-limiting exemplary embodiment, only the ending seed of the original test case is compared to the ending seed of the reproduced test case. As such, minimum information is used to determine reproducibility. Advantageously, the wait time for errors to occur in order to find issues in test case reproducibility is minimal. It is contemplated that intermediate seeds may also be compared.

When the ending seed of the reproduced test case is different from the ending seed of the original test case after the comparison, the original test case is deemed a non-reproducible test case. In accordance with one exemplary embodiment, the monitoring device 16 signals the indicating device 22 to report or indicate the non-reproducible test case. As such, developers of the test case generation device 12 can investigate where the sequence deviated from the original one.

Figure 2:
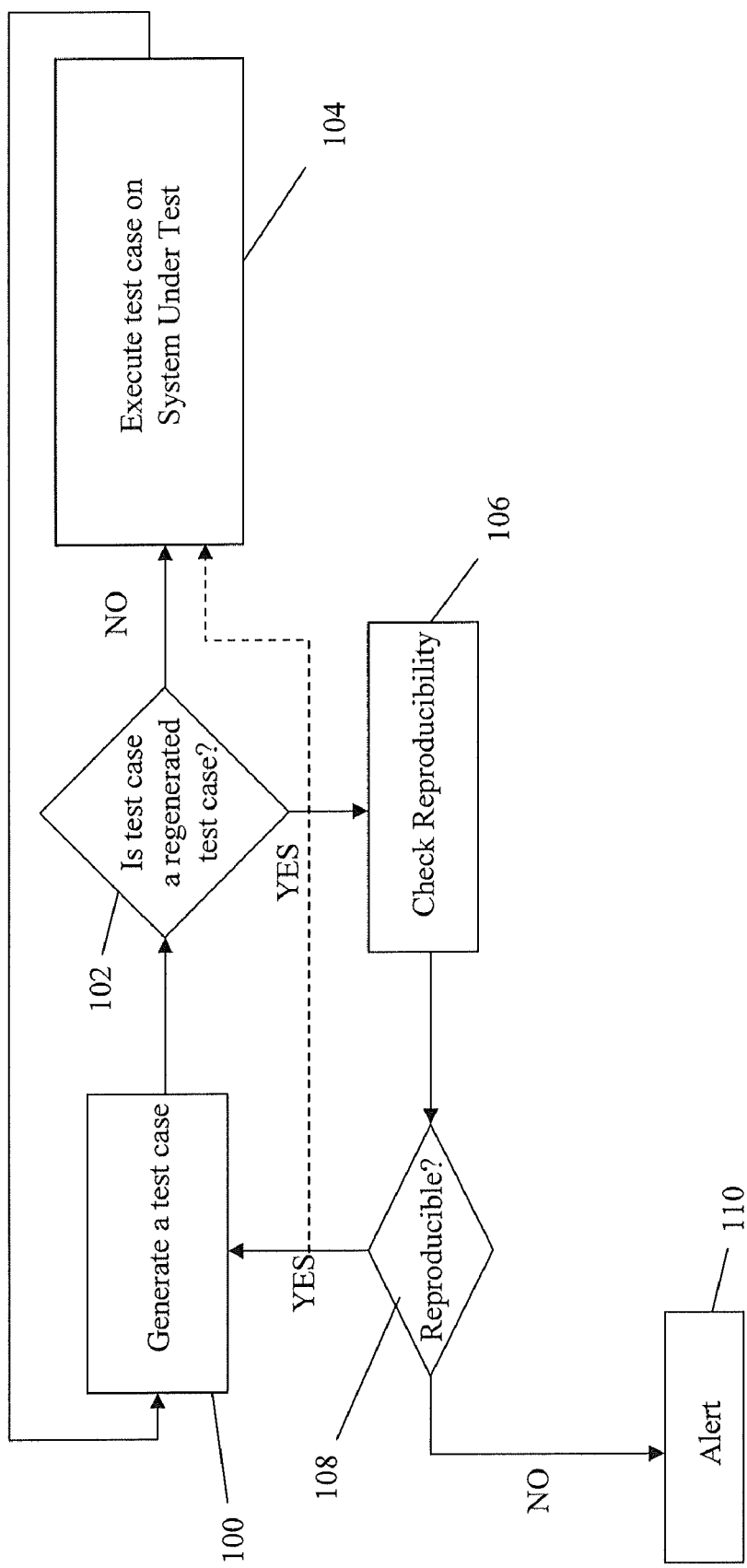
FIG. 2 is a flow diagram illustrating the basic process implemented by the pseudo-random test case generator system in accordance with one exemplary embodiment of the present invention.

Referring now to FIG. 2, a flowchart diagram is provided illustrating the basic process implemented by the pseudo-random test case generator device 12 in accordance with one exemplary embodiment. The test case builder at command block 100 generates a test case. At decision block 102, test case builder 14 determines whether or not the test case is a regenerated test case or a new test case. If the answer is no, then the test case builder 14 commands the system under test to perform or execute the test case at command block 104. If the answer is yes, the monitoring device checks whether the original test case was reproducible at command block 106. In accordance with one exemplary embodiment, this is accomplished by comparing the ending seed of the original test case to the ending seed of the regenerated test case of the original test case as described above. At decision block 108, the monitoring device determines whether the test case was reproducible. If the answer is no, then the monitoring device signals the indicating device to alert the operator at command block 110. If the answer is yes, the test case builder continues to either build a new test case or apply the test case to the system under test.

Figure 3:
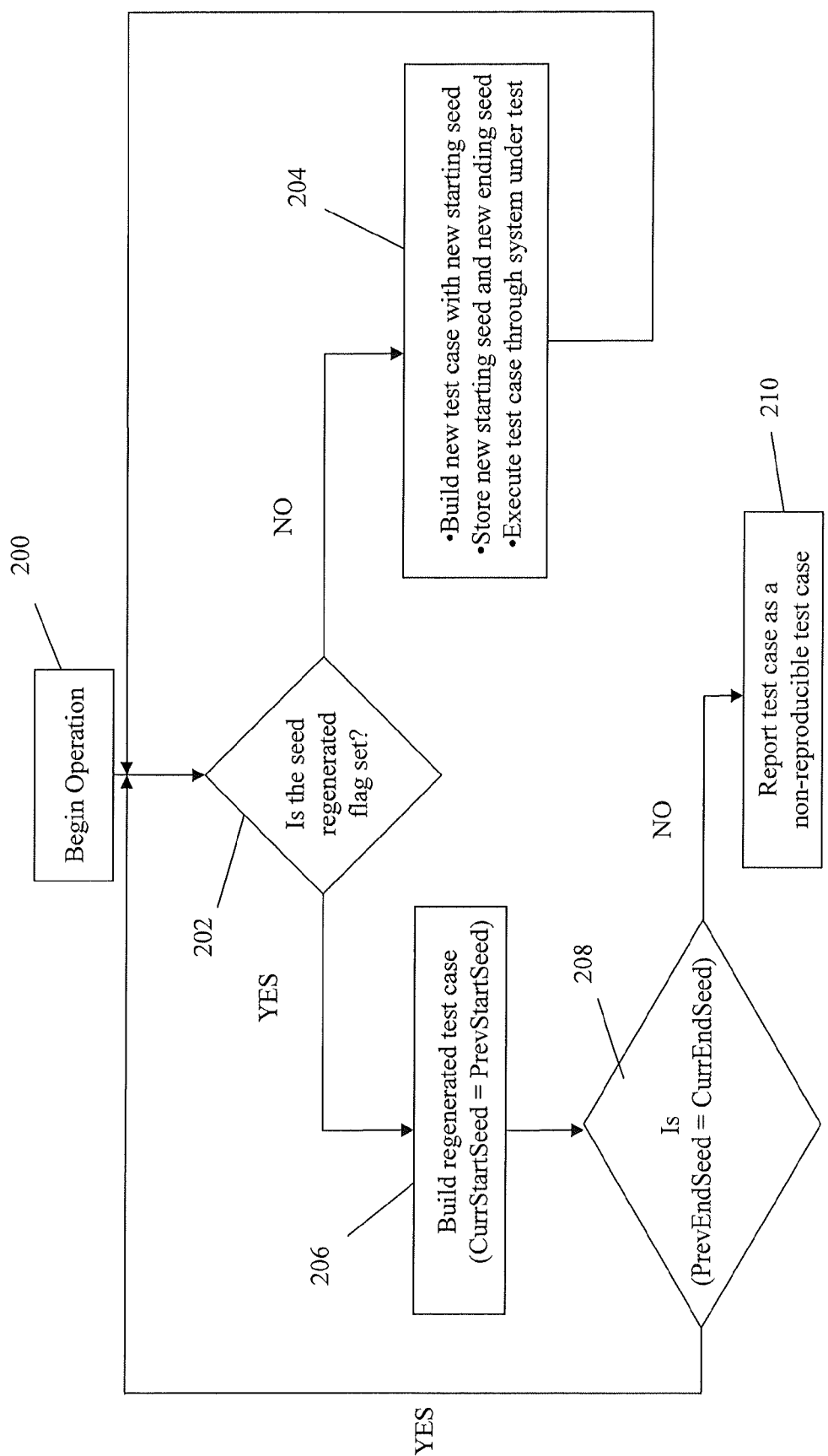
FIG. 3 is a flow diagram illustrating the basic steps of reproducing a test case in accordance with one exemplary embodiment of the present invention.

Referring now to FIG. 3, a flowchart diagram is provided illustrating the basic steps of reproducing a test case in accordance with one exemplary embodiment. The test case builder begins operation at block 200. At decision block 202, the test case builder determines whether a flag is set to regenerate an original test case. If the answer is no, the test case builder builds a new test case with a new starting seed and stores the new starting seed and the new ending seed of the new test case at command block 204. The new test case is also executed through the system under test in command block 204. If the answer is yes, the test case builder uses the starting seed of the original test case (PrevStartSeed) as the starting seed to build a test case that is a regeneration of the original test case (where CurrStartSeed=PrevStartSeed) at command block 206. At decision block 208, the monitoring device determines whether the ending seed of the original test case (PrevEndSeed) is the same as the ending seed of the regenerated test case (CurrEndSeed). If the answer is yes, return to block 202. If the answer is no, the indicating device reports the test case as a non-reproducible test case at command block 210.

Figure 4:
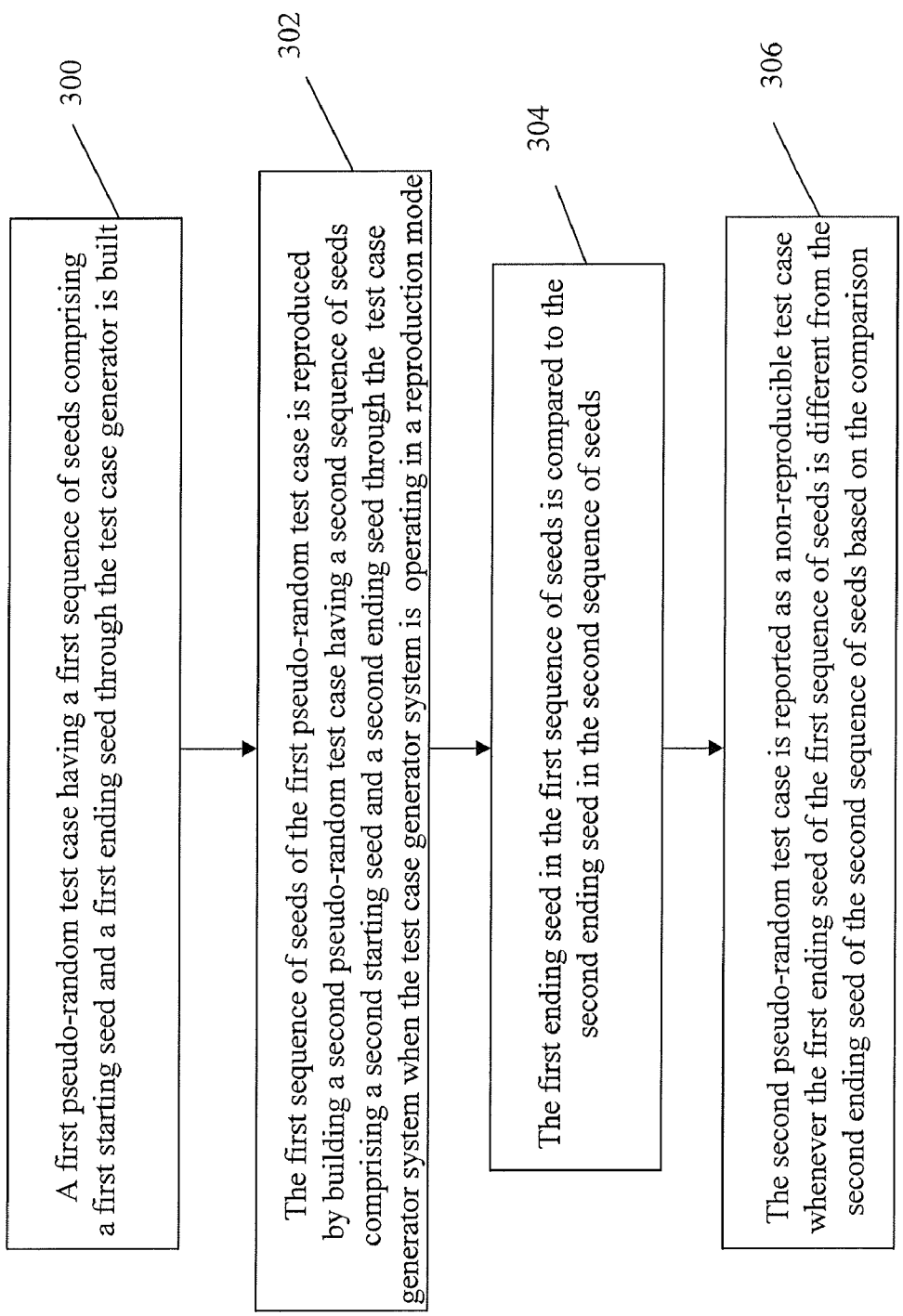
FIG. 4 is a flow diagram illustrating a method for monitoring a test case generator system by detecting non-reproducible pseudo-random test cases in accordance with one exemplary embodiment of the present invention.

In accordance with one exemplary embodiment of the present invention, an exemplary method for monitoring a test case generator system by detecting non-reproducible pseudo-random test cases is provided and illustrated in FIG. 4. In this exemplary method, a first pseudo-random test case having a first sequence of seeds comprising a first starting seed and a first ending seed through the test case generator system is built at block 300. Next, the first sequence of seeds of the first pseudo-random test case is reproduced by building a second pseudo-random test case having a second sequence of seeds comprising a second starting seed and a second ending seed through the test case generator system when the test case generator system is operating in a reproduction mode in block 302. In accordance with one exemplary embodiment, the first starting seed is used as the second starting seed of the second sequence of seeds. In block 304, the first ending seed in the first sequence of seeds is compared to the second ending seed in the second sequence of seeds. In block 306, the second pseudo-random test case is reported as a non-reproducible test case whenever the first ending seed of the first sequence of seeds is different from the second ending seed of the second sequence of seeds based on the comparison.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for monitoring a test case generator system by detecting non-reproducible pseudo-random test cases, the method comprising:
    building a first pseudo-random test case having a first sequence of seeds comprising a first starting seed and a first ending seed through the test case generator system;
    reproducing the first sequence of seeds of the first pseudo-random test case by building a second pseudo-random test case having a second sequence of seeds comprising a second starting seed and a second ending seed through the test case generator system when the test case generator system is operating in a reproduction mode, the first starting seed being used as the second starting seed of the second sequence of seeds; and
    comparing the first ending seed in the first sequence of seeds to the second ending seed in the second sequence of seeds.

2. The method as in claim 1, further comprising: reporting the second pseudo-random test case as a non-reproducible test case whenever the first ending seed of the first sequence of seeds is different from the second ending seed of the second sequence of seeds based on the comparison.

3. The method as in claim 1, further comprising: building an $n^{th}$ pseudo-random test case having an $n^{th}$ sequence comprising a $n^{th}$ starting seed and an $n^{th}$ ending seed when the reproduction mode is disabled, the $n^{th}$ starting seed being different from the first starting seed.

4. The method as in claim 1, wherein a system under test is in signal communication with the pseudo-random test case generator system, the system under test is configured to perform the first pseudo-random test case.

5. The method as in claim 1, wherein then test case generator system is configured to simulate a first number of applications to build the first pseudo-random test case.

6. The method as in claim 5, wherein the test case generator system is configured to simulate a second number of applications to build the second pseudo-random test case, the second number of applications being similar to the first number of applications.

7. The method as in claim 1, further comprising: storing the first starting seed and the first ending seed in a storage mechanism.

8. The method as in claim 1, wherein the test case generator system is operating under the same configuration and workload when building the first pseudo-random test case and the second pseudo-random test case.

9. A method for monitoring a test case generator system by detecting non-reproducible pseudo-random test cases, the method comprising:

building a first pseudo-random test case having a first sequence of seeds comprising a first starting seed and a first ending seed through the test case generator system;

storing the first starting seed and the second ending seed of the first pseudo-random test case in a storage mechanism;

reproducing the first sequence of seeds of the first pseudo-random test case by building a second pseudo-random test case having a second sequence of seeds comprising a second starting seed and a second ending seed through the test case generator system when the test case generator system is operating in a reproduction mode, the first starting seed stored in the storage mechanism being used as the second starting seed of the second sequence of seeds; and comparing the first ending seed in the first sequence of seeds to the second ending seed in the second sequence of seeds.

10. The method as in claim 9, further comprising: building $n^{th}$ pseudo-random test case having an $n^{th}$ sequence comprising a $n^{th}$ starting seed and an $n^{th}$ ending seed when the reproduction mode is disabled, the $n^{th}$ starting seed being different from the first starting seed.

11. The method as in claim 9, wherein a system under test is in signal communication with the pseudo-random test case generator system, the system under test is configured to perform the first pseudo-random test case.

12. The method as in claim 9, wherein then test case generator system is configured to simulate a first number of applications to build the first pseudo-random test case.

13. The method as in claim 12, wherein the test case generator system is configured to simulate a second number of applications to build the second pseudo-random test case, the second number of applications being similar to the first number of applications.

14. The method as in claim 12, wherein the test case generator system is operating under the same configuration and workload when building the first pseudo-random test case and the second pseudo-random test case.

15. The method as in claim 9, wherein an instructional flag is set in the test case generator system to control the frequency of the test case generator system operating in the reproduction mode.

16. The method as in claim 15, wherein the instructional flag is set randomly or with a predetermined frequency.

17. A pseudo-random test case generator system, comprising:

a test case building device configured to build a first pseudo-random test case having a first sequence of seeds comprising a first starting seed and a first ending seed, the test case building device further configured to reproduce the first sequence of seeds by building a second pseudo-random test case having a second sequence of seeds comprising a second starting seed and second ending seed when the test case building device is operating in a reproduction mode;

a storage device configured to store the first starting seed and the second ending seed of the first sequence of seeds, the test case building device reproduces the first sequence of seeds by using the first starting seed stored in the storage mechanism as the second starting seed of the second sequence of seeds; and a monitoring device configured to compare the first ending seed in the first sequence of seeds to the second ending seed in the second sequence of seeds.

18. The test case generator system as in claim 17, further comprising: an indicator device configured to alert an operator when the first ending seed in the first sequence of seeds is different from the second ending seed in the second sequence of seeds.

19. The test case generator system as in claim 17, further comprises a system under test configured for performing the first pseudo-random test case.

20. The test case generator system as in claim 17, wherein then test case building device is configured to simulate a first number of applications to build the first pseudo-random test case.

21. The test case generator system as in claim 20, wherein the test case building device is configured to simulate a second number of applications to build the second pseudo-random test case, the second number of applications being similar to the first number of applications.

22. The test case generator system as in claim 17, wherein the test case building device is operating under the same configuration and workload when building the first pseudo-random test case and the second pseudo-random test case.

23. The test case generator system as in claim 17, wherein an instructional flag is set in the test case building device to control the frequency of the test case building device operating in the reproduction mode.

24. The method as in claim 23, wherein the instructional flag is set randomly or with a predetermined frequency.

25. A pseudo-random test case generator system, comprising:

a test case building device configured to build a first pseudo-random test case having a first sequence of seeds comprising a first starting seed and a first ending seed, the test case building device further configured to reproduce the first sequence of seeds by building a second pseudo-random test case having a second sequence of seeds comprising a second starting seed and second ending seed when the test case building device is operating in a reproduction mode;

a storage device configured to store the first starting seed and the second ending seed of the first sequence of seeds, the test case building device reproduces the first sequence of seeds by using the first starting seed stored in the storage mechanism as the second starting seed of the second sequence of seeds;

a monitoring device configured to compare the first ending seed in the first sequence of seeds to the second ending seed in the second sequence of seeds; and an indicator device configured to alert an operator when the first ending seed in the first sequence of seeds is different from the second ending seed in the second sequence of seeds.

* * * * *